(12) United States Patent
Chen et al.

(10) Patent No.: US 12,176,346 B2
(45) Date of Patent: Dec. 24, 2024

(54) SEMICONDUCTOR DEVICES, SEMICONDUCTOR STRUCTURES AND METHODS FOR FABRICATING A SEMICONDUCTOR STRUCTURE

(71) Applicant: Taiwan Semiconductor Manufacturing Company, Ltd., Hsinchu (TW)

(72) Inventors: Chia-Chung Chen, Keelung (TW); Szu-Lin Liu, Hsinchu (TW); Jaw-Juinn Horng, Hsinchu (TW); Hui-Zhong Zhuang, Kaohsiung (TW); Chih-Liang Chen, Hsinchu (TW); Ya Yun Liu, Jhubei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 82 days.

(21) Appl. No.: 17/804,565

(22) Filed: May 30, 2022

(65) Prior Publication Data

US 2023/0127579 A1 Apr. 27, 2023

Related U.S. Application Data

(60) Provisional application No. 63/271,425, filed on Oct. 25, 2021.

(51) Int. Cl.
*H01L 27/082* (2006.01)
*G01K 7/01* (2006.01)
(Continued)

(52) U.S. Cl.
CPC ............. *H01L 27/082* (2013.01); *G01K 7/01* (2013.01); *H01L 21/8228* (2013.01);
(Continued)

(58) Field of Classification Search
CPC ............. H01L 27/082; H01L 27/0207; H01L 27/0623; H01L 27/0823; H01L 27/0825; H01L 27/0924; H01L 27/10879; H01L 29/0649; H01L 29/0657; H01L 29/0804–0834; H01L 29/0808; H01L 29/0821; H01L 29/1008; H01L 29/41708; H01L 29/41791; H01L 29/36; H01L 29/6625; H01L 29/735; H01L 29/732; H01L 29/7325; H01L 29/785;
(Continued)

(56) References Cited

U.S. PATENT DOCUMENTS 8,115,280 B2 2/2012 Chen et al.
8,373,229 B2 2/2013 Chen et al.
(Continued)

*Primary Examiner* — Natalia A Gondarenko
(74) *Attorney, Agent, or Firm* — Finnegan, Henderson, Farabow, Garrett & Dunner, L.L.P.

(57) ABSTRACT

A semiconductor device includes a bipolar junction transistor (BJT) structure including emitters in a first well having a first conductive type, collectors in respective second wells, the second wells having a second conductive type different from the first conductive type and being spaced apart from each other with the first well therebetween, and bases in the first well and between the emitters and the collectors. The BJT structure includes active regions having different widths that form the emitters, the collectors, and the bases.

20 Claims, 13 Drawing Sheets

(51) Int. Cl.
    *H01L 21/8228*     (2006.01)
    *H01L 29/06*     (2006.01)
    *H01L 29/08*     (2006.01)
    *H01L 29/10*     (2006.01)
    *H01L 29/66*     (2006.01)
    *H01L 29/735*     (2006.01)

(52) U.S. Cl.
    CPC ...... *H01L 29/0649* (2013.01); *H01L 29/0808* (2013.01); *H01L 29/1008* (2013.01); *H01L 29/6625* (2013.01); *H01L 29/735* (2013.01)

(58) Field of Classification Search
    CPC ......... H01L 29/78696; H01L 29/42304; H01L 29/42392; H01L 21/8249; H01L 21/823468; H01L 21/823493; H01L 21/8222; H01L 21/8228; H01L 21/823821; H01L 21/82285; H01L 21/76897; G01K 7/01
    USPC ................................ 257/557, 499, 587, 574
    See application file for complete search history.

(56) References Cited

U.S. PATENT DOCUMENTS

| | | | |
|---|---|---|---|
| 10,290,725 B2 | 5/2019 | Chu et al. | |
| 2010/0301453 A1* | 12/2010 | Chung | H01L 29/735 |
| | | | 257/574 |
| 2012/0187538 A1* | 7/2012 | Lin | H01L 29/732 |
| | | | 257/587 |
| 2014/0077331 A1* | 3/2014 | Hu | H01L 29/861 |
| | | | 438/237 |
| 2018/0323292 A1* | 11/2018 | Cho | H01L 29/0821 |
| 2021/0313310 A1* | 10/2021 | Yu | G06F 30/392 |

\* cited by examiner

SEMICONDUCTOR DEVICES, SEMICONDUCTOR STRUCTURES AND METHODS FOR FABRICATING A SEMICONDUCTOR STRUCTURE

REFERENCE TO RELATED APPLICATION

This application claims the benefit of U.S. Provisional Application No. 63/271,425, filed on Oct. 25, 2021, entitled "SEMICONDUCTOR DEVICE LAYOUT," the entirety of which is incorporated by reference herein.

BACKGROUND

During operation, integrated circuits (ICs) generate heat that causes the temperature of the ICs to increase. As the temperature of the ICs increases, the performance and efficiency of the ICs may be impacted in various ways in response to variations of resistance and capacitance values of different materials within the ICs.

A thermal sensor can be used to measure and monitor the temperature of the ICs during operation to facilitate temperature control of the ICs. Particularly, temperatures of ICs can be managed using heat sinks or other cooling devices. In some applications, the heat sinks or cooling devices are controlled based on the temperature of the ICs to reduce an amount of power consumed by the heat sinks or cooling devices. In some circuit designs, the thermal sensor may include bipolar junction transistors (BJTs) or resistive temperature sensors.

BRIEF DESCRIPTION OF THE DRAWINGS

Aspects of the present disclosure are best understood from the following detailed description when read with the accompanying figures. It is noted that, in accordance with standard practice in the industry, various features are not drawn to scale. In fact, the dimensions of the various features may be arbitrarily increased or reduced for clarity of discussion.

DETAILED DESCRIPTION

Figure 1:
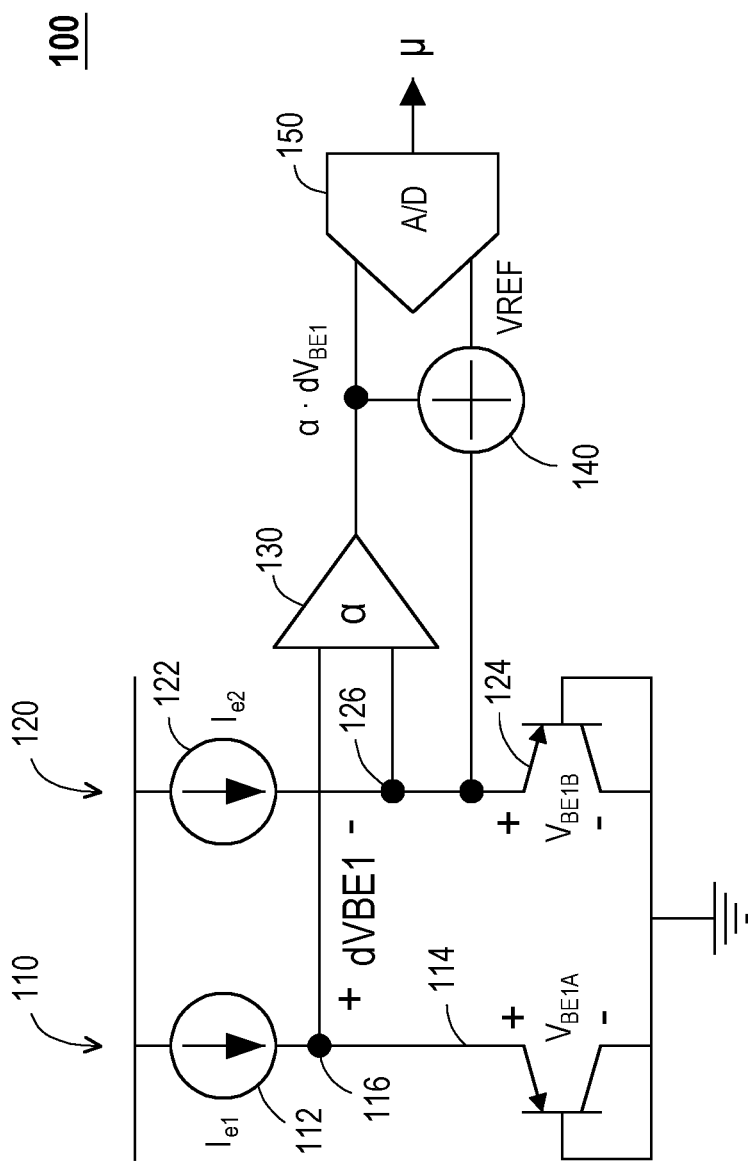
FIG. 1 is an exemplary thermal sensor circuit, in accordance with some embodiments of the present disclosure.

The following disclosure provides many different exemplary embodiments, or examples, for implementing different features of the presently disclosed subject matter. Specific simplified examples of components and arrangements are described below to explain the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In this document, the term "coupled" may also be termed as "electrically coupled", and the term "connected" may be termed as "electrically connected". "Coupled" and "connected" may also be used to indicate that two or more elements cooperate or interact with each other.

Various embodiments of the present disclosure will be described with respect to embodiments in a specific context, namely thermal sensors, or temperature sensors, which are widely used in various applications to sense a temperature. For example, thermal sensors can be used in integrated circuits, such as memory modules or central processing units (CPU), to monitor and facilitate control of the temperature of the integrated circuits to ensure the integrated circuits operate properly. In some embodiments, thermal sensors may employ bipolar junction transistors ("BJTs"). The voltage between terminal pairs, such as a base-emitter voltage VBE across the base-emitter junction of a BJT device, has a temperature dependency providing electrical characteristics to achieve thermal sensing. For example, in ideal cases, the base-emitter voltage VBE may provide an exponential temperature dependency. Deviations from the ideal characteristics may cause errors in temperature measurements.

In some embodiments, the thermal sensor usually uses a bipolar junction transistor (BJT) ratio to coarsely or finely adjust a slope of a differential voltage (dVBE) curve of the differential voltage (dVBE) versus temperature. The thermal sensor may also use a current mirror and a resistor ratio to adjust the slope of the dVBE curve. However, a large slope adjustment of the dVBE may reduce the performance and accuracy of a calibration process for the thermal sensor.

FIG. 1 is an exemplary thermal sensor circuit 100, in accordance with some embodiments of the present disclosure. As shown in FIG. 1, the thermal sensor circuit 100 includes a BJT pair having branches 110, 120. Branches 110, 120 respectively include corresponding current sources 112 and 122, and transistors 114 and 124 connected in series with the current sources 112 and 122. The base and collector in each of the transistors 114 and 124 are connected to each other and connected to a common reference node, e.g., a ground reference. Emitters of the transistors 114 and 124 are respectively connected to the corresponding current sources 112 and 122.

An amplifier 130 is connected to nodes 116 and 126 (e.g., emitters of the transistors 114 and 124). Particularly, two input terminals of the amplifier 130 are connected to the respective nodes 116 and 126 to receive a differential signal $dV_{BE1}$, which is the difference between the base-emitter voltage $V_{BE1A}$ at the emitter of the transistor 114 and the base-emitter voltage $V_{BE1B}$ at the emitter of the transistor 124.

The base-emitter voltages $V_{BE1A}$ and $V_{BE1B}$ of the transistors 114 and 124 are complementary to absolute temperature (CTAT) voltages, while the difference between the two base-emitter voltages, $dV_{BE1}$, is a proportional to absolute temperature (PTAT) voltage.

In some embodiments, the amplifier 130 has a gain α, which is a calibration parameter, to amplify the differential signal $dV_{BE1}$ to generate $V_{PTAT}$, where the value of a can be optimized according to practical needs. In one example, α can be defined as: int($V_{BE1B}$(105° C.)–$V_{BE1B}$(25° C.)/($dV_{BE1}$(105° C.)–$dV_{BE1}$(25° C.))), in which int( ) function returns the integer value of its argument, but the present disclosure is not limited thereto.

In some embodiments, an adder 140 is coupled to the output of the amplifier 130 and the emitter of the BJT transistor 124 to obtain a reference voltage VREF, which can be expressed as:

$$VREF = V_{BE1B} + \alpha \cdot dV_{BE1}$$

The temperature (T) can then be measured by digitizing $\alpha \cdot dV_{BE1}$ with respect to VREF with the help of an integrated ADC 150 to obtain a ratio μ, (e.g., $\alpha \cdot dV_{BE1}$/VREF). The ratio μ can then be converted to a temperature value, e.g., degrees Celsius.

In the embodiments of FIG. 1, when the BJT transistors 114 and 124 are embedded directly into a CPU structure, the thermal sensor circuit 100 can detect the CPU temperature.

Figure 2:
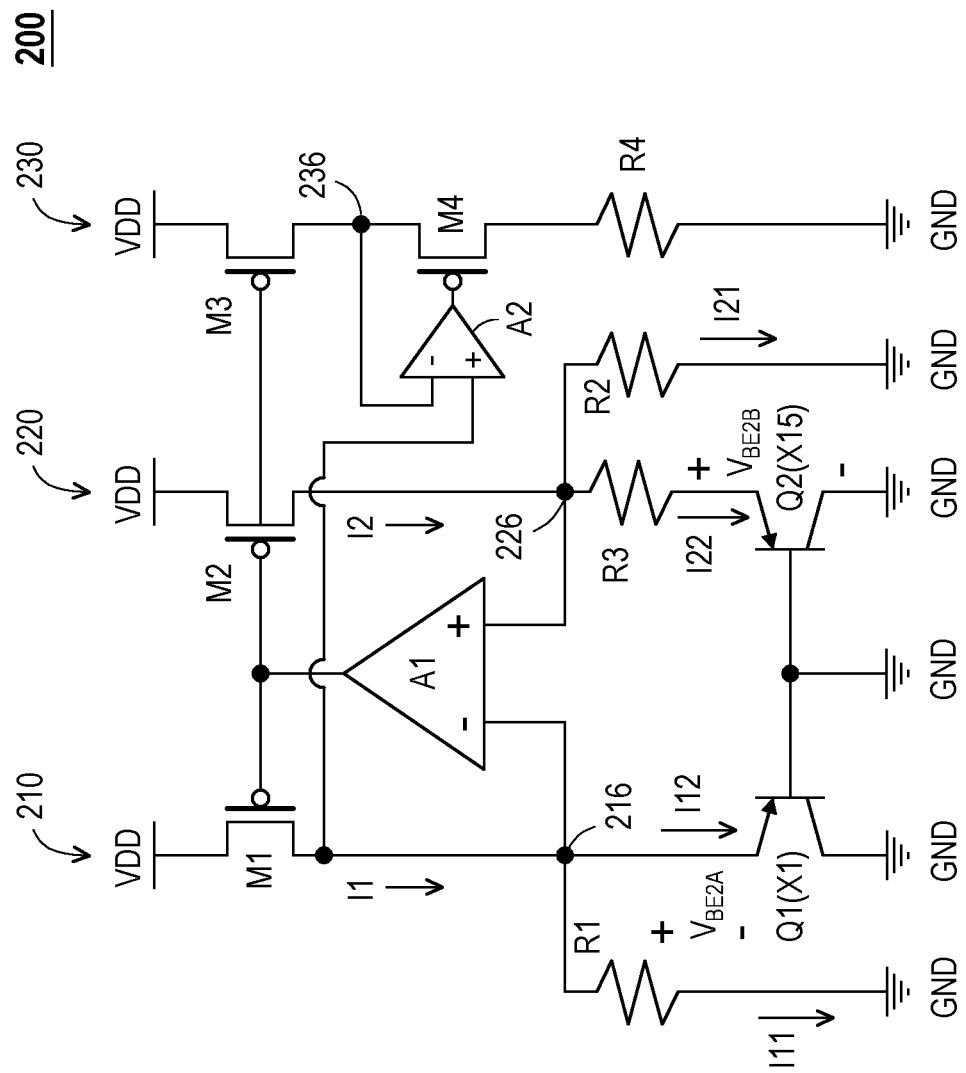
FIG. 2 is an exemplary bandgap reference circuit, in accordance with some embodiments of the present disclosure.

FIG. 2 is an exemplary circuit 200, in accordance with some embodiments of the present disclosure. In the circuit 200 of FIG. 2, a Complementary-To-Absolute-Temperature (CTAT) voltage component is the base-emitter voltage (VBE) of a Bipolar Junction Transistor (BJT). A Proportional-To-Absolute-Temperature (PTAT) voltage component (ΔVBE) is the difference of the base-emitter voltages of two BJTs with different current densities.

As shown in FIG. 2, the circuit 200 is a bandgap reference circuit 200 including transistors M1, M2, M3 and M4, resistors R1, R2, R3, and R4, bipolar transistors Q1 and Q2, and error amplifiers A1 and A2. In a first branch 210, the transistor M1 and the bipolar transistor Q1 are electrically coupled in series between a supply voltage node VDD and a common reference node, e.g., ground node GND reference, and the resistor R1 is electrically coupled in parallel with the bipolar transistor Q1. In a second branch 220, the transistor M2, the resistor R3, and the bipolar transistor Q2 are electrically coupled in series between the supply voltage node VDD and the ground node GND, and the resistor R2 is electrically coupled in parallel with the series of the resistor R3 and the transistor Q2. In a third branch 230, the transistors M3, M4 and the resistor R4 are electrically coupled in series between the supply voltage node VDD and the ground node GND.

In branches 210 and 220, the two resistors R1 and R2 provide current paths for two currents I11 and I21. In some embodiments, the resistance value of resistors R1 and R2 may be the same. As shown in FIG. 2, the ratio of the emitter area may be 1:15 between transistors Q1 and Q2, but the present disclosure is not limited thereto. Accordingly, the transistors Q1 and Q2 may be BJTs biased with different current densities and form a compensation circuit to compensate the temperature dependence by generating a PTAT voltage across the resistor R3, and the base terminals of the transistors Q1 and Q2 are electrically coupled to the ground node GND.

The error amplifier A1 has two input terminals respectively coupled to the node 216 and the node 226. The node 216 is the emitter terminal of the transistor Q1 in the branch 210, and the node 226 is the emitter terminal of the transistor Q2 in the branch 220. An output terminal of the error amplifier A1 is electrically coupled to the control terminals (e.g., gate terminals) of transistors M1, M2 and M3. Particularly, the amplifier A1 equalizes currents I1 and I2 and voltages at the node 216 and the node 226. At the node 216, the current I1 equals the current I11 flowing through the resistor R1 plus the current I12 flowing through the bipolar transistor Q1. Similarly, at the node 226, the current I2 equals the current I21 flowing through the resistor R2 plus the current I22 flowing through the resistor R3 and the bipolar transistor Q2.

A reference voltage $V_{BE2A}$ is the voltage at the node 216 and the base-emitter voltage VBE of the transistor Q1 (i.e., a base-emitter voltage (VBE) of the transistor Q1) such that the reference voltage $V_{BE2A}$ has a negative temperature coefficient. The voltage across the base and emitter of the transistor Q2 is referred to as another reference voltage $V_{BE2B}$. Accordingly, the reference voltages $V_{BE2A}$ and $V_{BE2B}$ are temperature dependent as complementary to absolute temperature (i.e., voltages with a negative temperature coefficient). Given that the voltage at the node 216 is equal to the voltage at the node 226, the voltage across the resistor R3 is the voltage difference between the base-emitter voltage $V_{BE2A}$ and the base-emitter voltage $V_{BE2B}$ of the transistor Q2.

The error amplifier A2 has two input terminals respectively coupled to the node 216 and the node 236. The transistors M3 and M4 are coupled to each other at the node 236. An output terminal of the error amplifier A2 is electrically coupled to the control terminal (e.g., the gate terminal) of the transistor M4. Accordingly, the error amplifier A2 and the transistor M4 form a feedback control loop. In some embodiments, the error amplifiers A1 and A2 each have a high voltage gain. As a result, the voltage of the node 216, the voltage of the node 226, and the voltage of the node 236 are equal.

Figure 3:
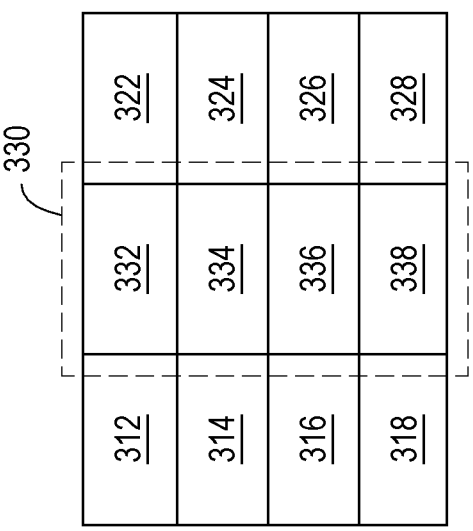
FIG. 3 is an exemplary diagram illustrating a portion of a layout design for an integrated circuit (IC), in accordance with some embodiments of the present disclosure.

FIG. 3 is an exemplary diagram illustrating a portion of a layout design 300 for an integrated circuit (IC), in accordance with some embodiments of the present disclosure. The layout design 300 includes multiple standard cells (STD cells) forming a cell array capable of performing a specific function. For example, the thermal sensor circuit 100 in FIG. 1 and the bandgap voltage reference circuit 200 in FIG. 2 can be designed using the standard cells in the layout design 300. A standard cell, in some embodiments, refers to a pre-designed cell that has been laid out and stored in a circuit library that is in the form of a database. In the design of integrated circuits, the standard cell is retrieved from the circuit library and is placed in a placement operation. The placement operation is performed, for example, using a computer which runs the software for designing integrated circuits. The software includes a circuit layout tool, which has a function of placement and routing. In the embodiments of FIG. 3, first standard cells 312, 314, 316, and 318 are arranged along a first direction in a column, and second standard cells 322, 324, 326, and 328 are also arranged along the first direction in another column. Third standard cells 332, 334, 336, and 338 are arranged along the first direction in yet another column and between the first standard cells 312, 314, 316, and 318 and the second standard cells 322, 324, 326, and 328.

In some embodiments, first standard cells 312, 314, 316, and 318 and second standard cells 322, 324, 326, and 328 may be logic gate cells. In some embodiments, a logic gate cell includes an AND, OR, NAND, NOR, XOR, INV, AND-OR-Invert (AOI), OR-AND-Invert (OAI), MUX, Flip-flop, BUFF, Latch, delay, clock cells, or the like. In some embodiments, standard cells may be memory cells. In some embodiments, a memory cell includes a static random access memory (SRAM), a dynamic RAM (DRAM), a resistive RAM (RRAM), a magnetoresistive RAM (MRAM) read only memory (ROM), or the like. In some embodiments, standard cells may include one or more active or passive elements. Examples of active elements include, but are not limited to, transistors and diodes. Examples of transistors include, but are not limited to, metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), etc.), FinFETs, planar MOS transistors with raised source/drain, or the like. Examples of passive elements include, but are not limited to, capacitors, inductors, fuses, resistors, or the like. The first standard cells 312, 314, 316, and 318 and the second standard cells 322, 324, 326, and 328 may include other features not shown for ease of illustration.

As shown in FIG. 3, standard cells 332, 334, 336, and 338 form a BJT transistor cell 330 which directly abuts a digital Fin Boundary (FB) CPU region and is adjacent to the first standard cells 312, 314, 316, and 318 and the second standard cells 322, 324, 326, and 328. Accordingly, the BJT transistor cell 330 may align with the standard cells 312-318, and the standard cells 322-328. Alternatively stated, a height of the transistor cell 330 may be aligned with the height of the standard cells 312, 314, 316, and 318 and the height of the second standard cells 322, 324, 326, and 328. By such an arrangement, the BJT can be directly embedded into a CPU design to detect the CPU temperature difference by a thermal sensor circuit, e.g., the thermal sensor circuit 100 shown in FIG. 1, or directly embedded into the bandgap reference circuit 200 shown in FIG. 2. Thus, the BJT can be arranged closer to the CPU and direct abut with the CPU, which provides less area penalty and reduces a design margin in the thermal sensor circuit.

In addition, by the BJT design being implemented by standard cells in the digital Fin Boundary (FB) CPU region, the thermal sensor circuit may thus be provided closer to a hot spot location of the CPU design to detect the temperature of the CPU and thereby improve thermal throttling of the CPU and prevent CPU degradation. In various embodiments, BJTs structures formed using the standard cells can be implemented into various fabrication process, including the fabrication process for FinFET, nanosheet, and nanowire devices.

Figure 4A:
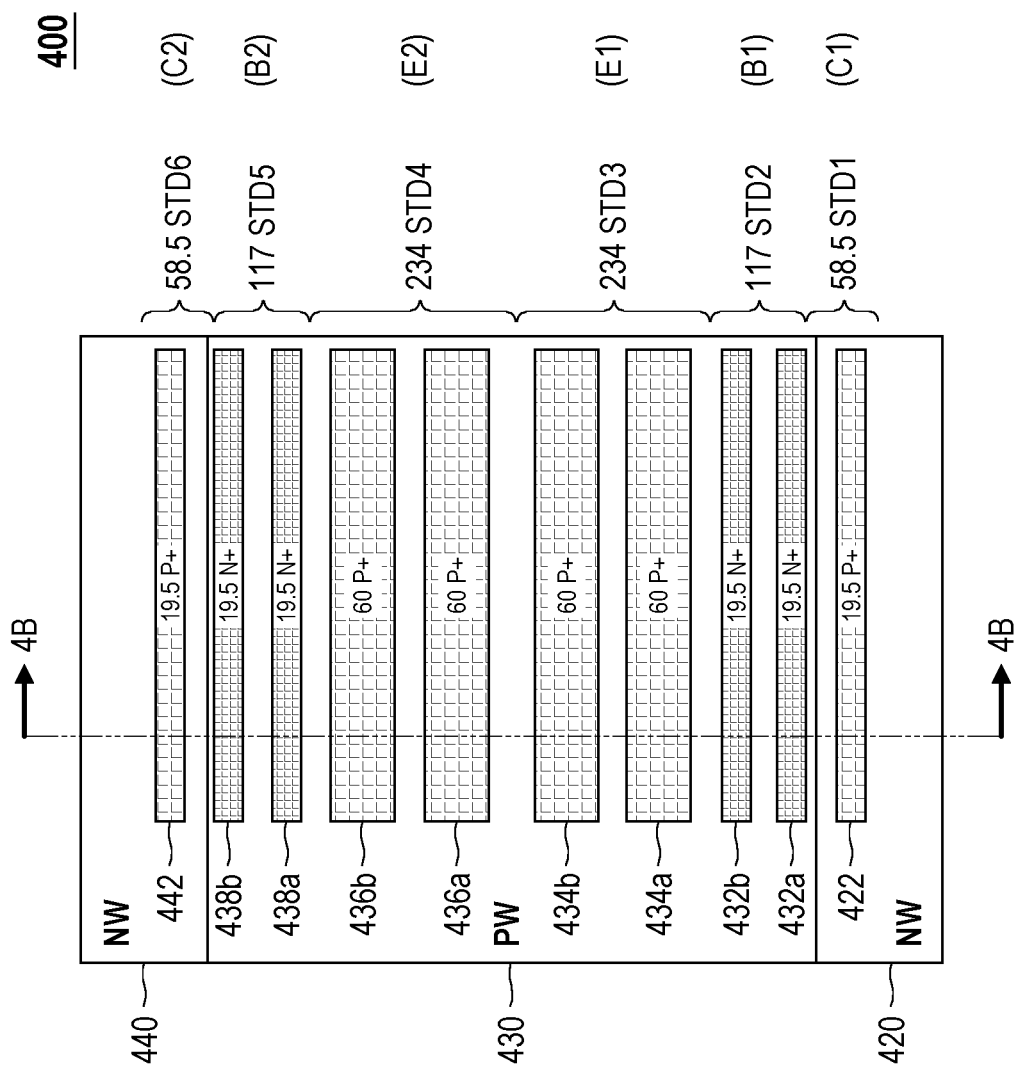
FIG. 4A illustrates a top view of a PNP bipolar junction transistor (BJT) structure including standard cells, in accordance with some embodiments of the present disclosure.
Figure 4B:
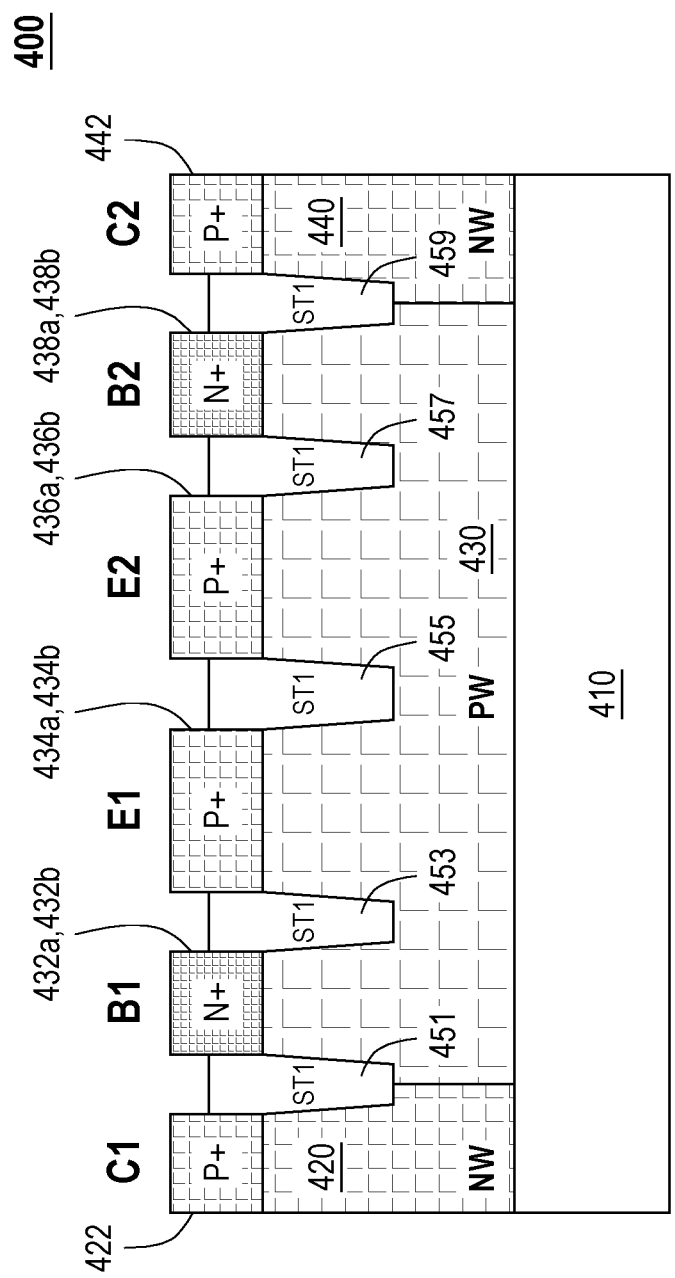
FIG. 4B illustrates a cross-sectional view of the PNP BJT structure along section line 4B-4B shown in FIG. 4A, in accordance with some embodiments of the present disclosure.

FIG. 4A illustrates a top view of a bipolar junction transistor (BJT) structure 400 including standard cells in a digital FIN boundary region, in accordance with some embodiments of the present disclosure. FIG. 4B illustrates a cross-sectional view of the BJT structure 400 as shown in FIG. 4A, in which the cross-sectional view is taken along a plane crossing section line 4B-4B, in accordance with some embodiments of the present disclosure. In the embodiments of FIG. 4A and FIG. 4B, P-P-N-N standard cells are used to form two BJT devices. The BJT structure 400 includes two emitters E1 and E2, two collectors C1 and C2, and two bases B1 and B2. Emitters E1 and E2 and collectors C1 and C2 are of p-type, while bases B1 and B2 are of n-type. Shallow trench isolation (STI) regions 451, 453, 455, 457, and 459 separate the emitters E1 and E2, the collectors C1 and C2, and the bases B1 and B2.

As shown in FIG. 4A, a p-type (P+) active region 422 in a p-well region 420 forms the collector C1 of the BJT structure 400. N-type (N+) active regions 432a, 432b in a n-well region 430 form the base B1 of the BJT structure 400. P-type (P+) active regions 434a, 434b in the n-well region 430 form the emitter E1 of the BJT structure 400. P-type (P+) active regions 436a, 436b in the n-well region 430 form the emitter E2 of the BJT structure 400. N-type (N+) active regions 438a, 438b in the n-well region 430 form the base B2 of the BJT structure 400. A p-type (P+) active region 442 in a p-well region 440 forms the collector C2 of the BJT structure 400.

In some embodiments, standard cells STD1-STD6 forming the BJT structure 400 include different types of standard cells with different cell heights and different widths of active regions. For example, the emitters E1 and E2 of the BJT structure 400 are respectively formed by standard cells STD3 and STD4 with cell heights H3 and H4, the bases B1 and B2 of the BJT structure 400 are respectively formed by standard cells STD2 and STD5 with cell heights H2 and H5, and the collectors C1 and C2 of the BJT structure 400 are respectively formed by standard cells STD1 and STD6 with cell heights H1 and H6. Amongst standard cells STD1-STD6, standard cells STD1 and STD6 have the smallest size and are most power saving standard cells. In some embodiments, standard cells STD1 and STD6 are smaller in height than the standard cells STD2 and STD5, and the standard cells STD2 and STD5 are smaller in height than the standard cells STD3 and STD4.

In one exemplary embodiment, the p-type (P+) active region 422 forming the collector C1 is in the standard cell STD1 having a height H1 of approximately 58.5 nm, and the width W1 of the active region 422 is approximately 19.5 nm. N-type (N+) active regions 432a, 432b forming the base B1 are in the standard cell STD2 having a height H2 of approximately 117 nm, and the width W2 of each of the active regions 432a, 432b is approximately 19.5 nm. P-type (P+) active regions 434a, 434b forming the emitter E1 are in the standard cell STD3 having a height H3 of 234 nm, and the width W3 of each of the active regions 434a, 434b is approximately 60 nm. The width W3 is greater than the width W2 and the width W1.

Still with reference to the exemplary embodiment, P-type (P+) active regions 436a, 436b forming the emitter E2 are in the standard cell STD4 having a height H4 of 234 nm, and the width W4 of each of the active regions 436a, 436b is approximately 60 nm. N-type (N+) active regions 438a, 438b forming the base B2 are in the standard cell STD5 having a height H5 of approximately 117 nm, and the width W5 of each of the active regions 438a, 438b is approximately 19.5 nm. The p-type (P+) active region 442 forming the collector C2 is in the standard cell STD6 having a height H6 of approximately 58.5 nm, and the width W6 of the active region 442 is approximately 19.5 nm. The width W4 is greater than the width W5 and the width W6.

Accordingly, by combining P-P-N-N standard cells to form the BJT structure 400 and including standard cells with different widths of active regions, the emitter area of each BJT may be designed to be larger to reduce the mismatch between the BJTs described above with reference to FIG. 2, and the base area of each BJT may be designed to be smaller for a desired common-emitter current gain. Furthermore, the total area of each BJT may be reduced. For example, in some embodiments, a total height required for the BJT structure 400 may be approximately 1.053 µm, which is smaller than a typical BJT structure, but the present disclosure is not limited thereto.

As shown in FIG. 4B, a substrate 410 may be a p-type substrate 410. P-well region 420, n-well region 430, and p-well region 440 may be formed on the substrate 410. In some embodiments, the p-well region 420, the n-well region 430, and the p-well region 440 are separated from the substrate 410 by a buried layer. In some embodiments, the width of the shallow trench isolation (STI) structure 455 separating the two emitters E1 and E2 is greater than the width of the STI structure 453 separating the emitter E1 and the base B1, or the width of the STI structure 457 separating the emitter E2 and the base B2. In some embodiments, the width of the STI structure 451 separating the collector C1 and the base B1 and the width of the STI structure 459 separating the collector C2 and the base B2 are substantially the same as the width of the STI structures 453 and 457.

For example, in some embodiments, a space between the collector C1 and the base B1 is approximately 39 nm. A space between the base B1 and the emitter E1 is approximately 39 nm. A space the emitter E1 and the emitter E2 is approximately 57 nm. A space between the emitter E2 and the base B2 is approximately 39 nm. A space between the base B2 and the collector C2 is approximately 39 nm.

Figure 4C:
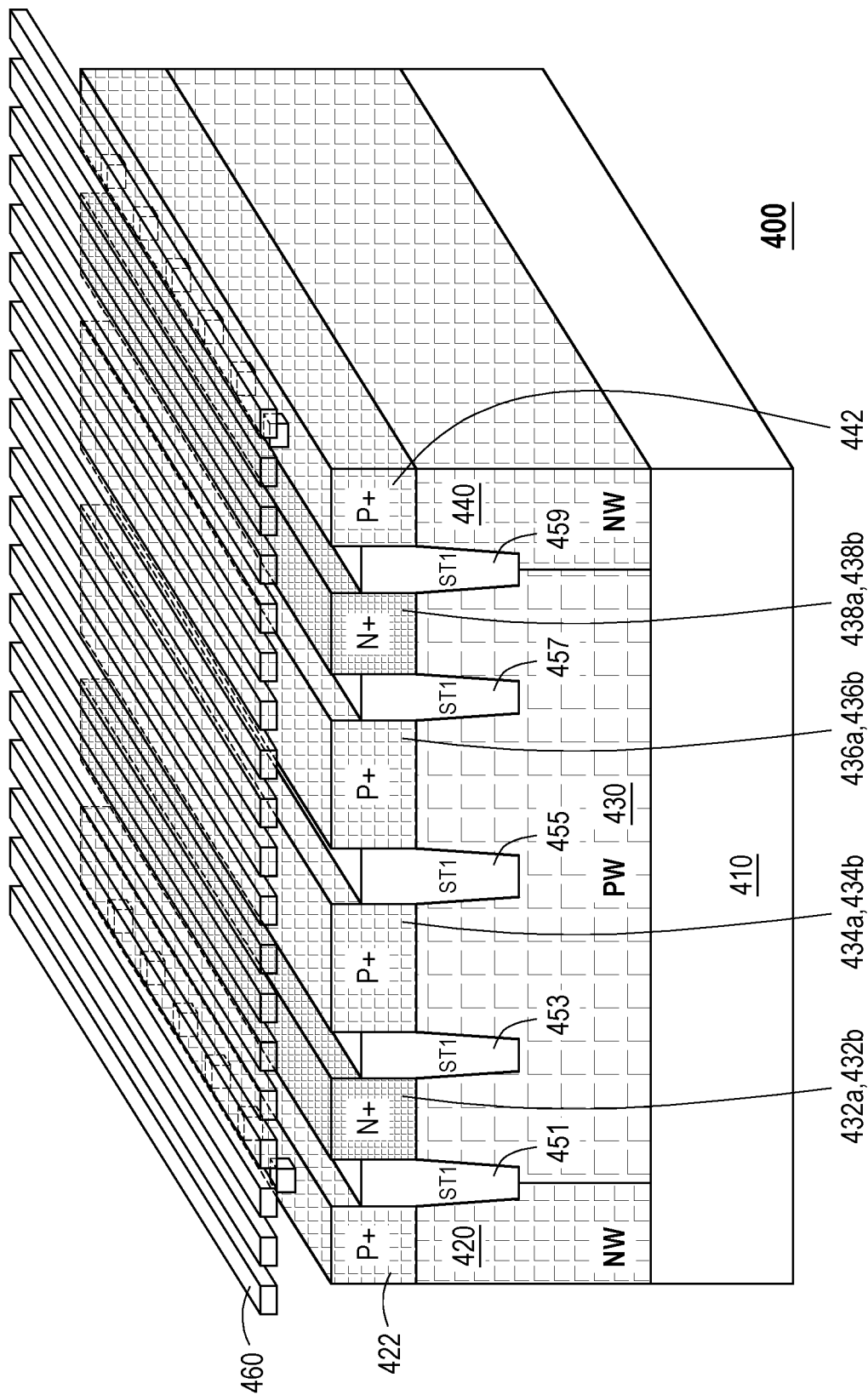
FIG. 4C is a perspective view illustrating the PNP BJT structure, in accordance with some embodiments of the present disclosure.

FIG. 4C is a perspective view illustrating the bipolar junction transistor (BJT) structure 400, in accordance with some embodiments of the present disclosure. As shown in FIG. 4C, the BJT structure 400 further includes a metal layer M0 including one or more conductive features 460 to provide interconnections. For example, the metal layer M0 may provide one or more conductive features 460 for connecting the collector C1 and the collector C2 to the ground reference, in order to implement the BJT structure 400 to be used in the thermal sensor circuit 100 in FIG. 1 or the circuit 200 in FIG. 2.

It is noted that, while the BJT structure 400 illustrated in FIG. 4A-FIG. 4C is a PNP BJT transistor formed by standard cells, the present disclosure is not limited thereto. In some other embodiments, an NPN BJT transistor may also be formed by standard cells.

Figure 5A:
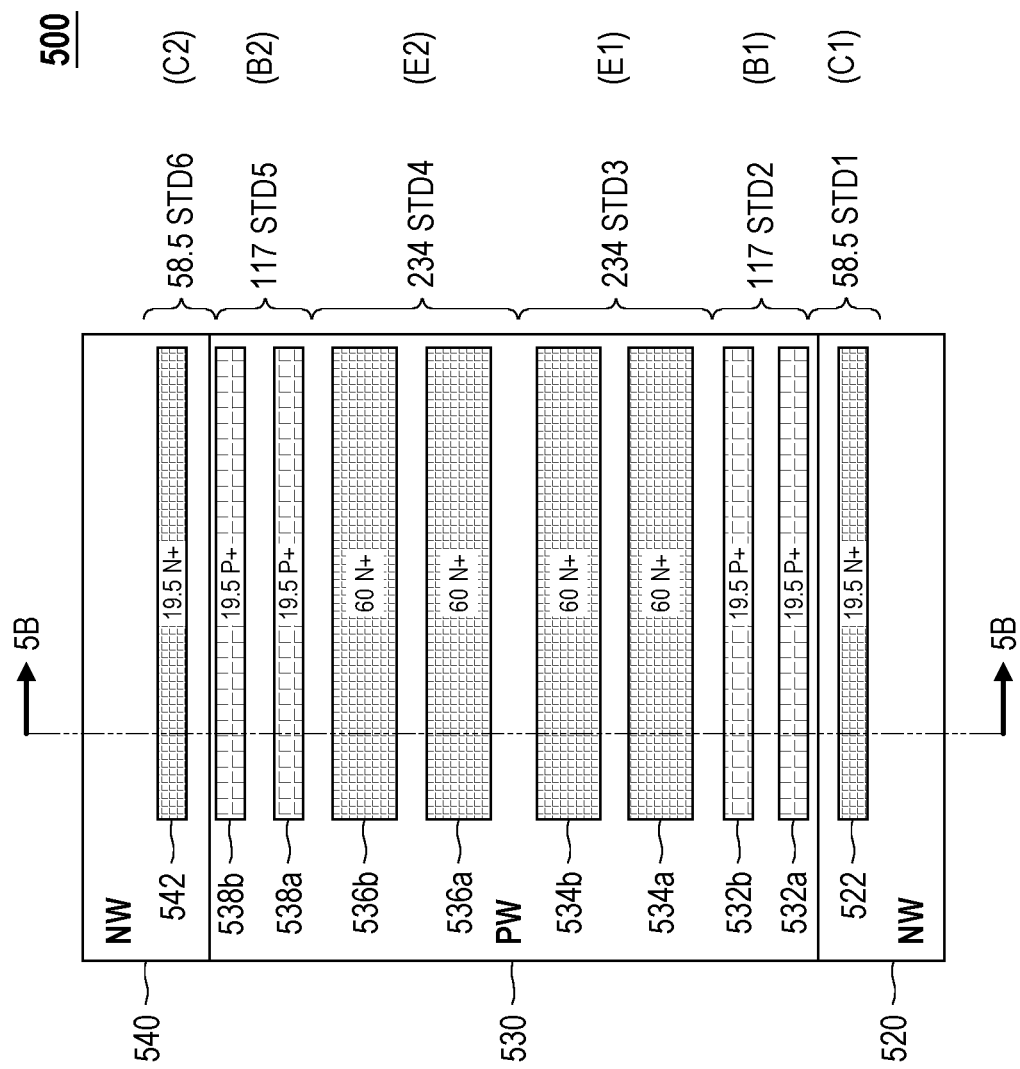
FIG. 5A illustrates a top view of an NPN BJT structure including standard cells, in accordance with some embodiments of the present disclosure.

FIG. 5A illustrates a top view of an NPN BJT structure 500 including standard cells in a digital FIN boundary region, in accordance with some embodiments of the present disclosure. Similar to the embodiments of FIG. 4A-FIG. 4C, the BJT structure 500 also includes two emitters E1 and E2, two collectors C1 and C2, and two bases B1 and B2. Compared to the BJT structure 400, in the BJT structure 500, emitters E1 and E2 and collectors C1 and C2 are of n-type, while bases B1 and B2 are of p-type.

As shown in FIG. 5A, n-type (N+) active region 522 in an n-well or a deep n-well region 520 forms the collector C1 of the BJT structure 500. P-type (P+) active regions 532a, 532b in a p-well region 530 form the base B1 of the BJT structure 500. N-type (N+) active regions 534a, 534b in the p-well region 530 form the emitter E1 of the BJT structure 500. N-type (N+) active regions 536a, 536b in the p-well region 530 form the emitter E2 of the BJT structure 500. P-type (P+) active regions 538a, 538b in the p-well region 530 form the base B2 of the BJT structure 500. A p-type (P+) active region 542 in an n-well or a deep n-well region 540 forms the collector C2 of the BJT structure 500.

Similarly, standard cells STD1-STD6 forming the BJT structure 500 also include different types of standard cells with different cell heights and different widths of active regions. For example, the emitters E1 and E2 of the BJT structure 500 are respectively formed by standard cells STD3 and STD4 with cell heights H3 and H4, the bases B1 and B2 of the BJT structure 400 are respectively formed by standard cells STD2 and STD5 with cell heights H2 and H5, and the collectors C1 and C2 of the BJT structure 400 are respectively formed by standard cells STD1 and STD6 with cell heights H1 and H6. Amongst standard cells STD1-STD6, standard cells STD1 and STD6 have the smallest size and are most power saving standard cells. In some embodiments, standard cells STD1 and STD6 are smaller in height than the standard cells STD2 and STD5, and the standard cells STD2 and STD5 are smaller in height than the standard cells STD3 and STD4.

In one exemplary embodiment, the n-type (N+) active region 522 forming the collector C1 is in the standard cell STD1 having a height H1 of approximately 58.5 nm, and the width W1 of the active region 522 is approximately 19.5 nm. P-type (P+) active regions 532a, 532b forming the base B1 are in the standard cell STD2 having a height H2 of approximately 117 nm, and the width W2 of each of the active regions 532a, 532b is approximately 19.5 nm. N-type (N+) active regions 534a, 534b forming the emitter E1 are in the standard cell STD3 having a height H3 of 234 nm, and the width W3 of each of the active regions 534a, 534b is approximately 60 nm. The width W3 is greater than the width W2 and the width W1.

Still with reference to the one exemplary embodiment, N-type (N+) active regions 536a, 536b forming the emitter E2 are in the standard cell STD4 having a height H4 of 234 nm, and the width W4 of the active regions 536a, 536b is approximately 60 nm. P-type (P+) active regions 538a, 538b forming the base B2 are in the standard cell STD5 having a height H5 of approximately 117 nm, and the width W5 of the active regions 538a, 538b is approximately 19.5 nm. The n-type (N+) active region 542 forming the collector C2 is in the standard cell STD6 having a height H6 of approximately 58.5 nm, and the width W6 of the active region 542 is approximately 19.5 nm. The width W4 is greater than the width W5 and the width W6.

Figure 5B:
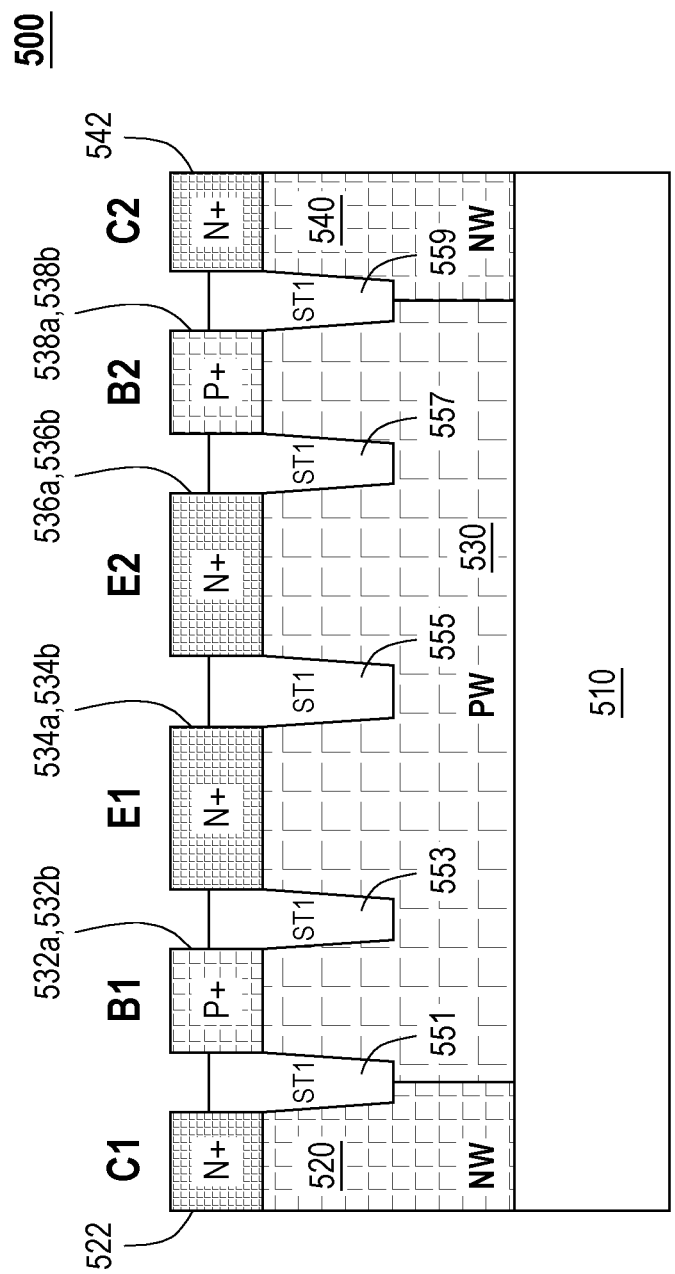
FIG. 5B illustrates a cross-sectional view of the NPN BJT structure along section line 5B-5B shown in FIG. 5A, in accordance with some embodiments of the present disclosure.

FIG. 5B illustrates a cross-sectional view of the NPN BJT structure 500 as shown in FIG. 5A, in which the cross-sectional view is taken along a plane crossing section line 5B-5B, in accordance with some embodiments of the present disclosure. As shown in FIG. 5B, n-well region 520, p-well region 530, and n-well region 540 may be formed on a substrate 510. In some embodiments, the n-well region 520, the p-well region 530, and the n-well region 540 are separated from the substrate 510 by a buried layer. Shallow trench isolation (STI) regions 551, 553, 555, 557, and 559 separate the emitters E1 and E2, the collectors C1 and C2, and the bases B1 and B2. In some embodiments, the width of the shallow trench isolation (STI) structure 555 separating two emitters E1 and E2 is greater than the width of the STI structure 553 separating the emitter E1 and the base B1, or the width of the STI structure 557 separating the emitter E2 and the base B2. In some embodiments, the width of STI structure 551 separating the collector C1 and the base B1 and the width of STI structure 559 separating the collector C2 and the base B2 are substantially the same as the width of the STI structures 553 and 557.

For example, in some embodiments, a space between the collector C1 and the base B1 is approximately 39 nm. A space between the base B1 and the emitter E1 is approximately 39 nm. A space the emitter E1 and the emitter E2 is approximately 57 nm. A space between the emitter E2 and the base B2 is approximately 39 nm. A space between the base B2 and the collector C2 is approximately 39 nm.

Accordingly, in the FIGS. 5A and 5B, the BJT structure 500 including standard cells with different cell heights and different widths of active regions may also provide a relatively large emitter area to reduce the mismatch in the BJTs described above with reference to FIG. 2, and a relatively small base area for the desired common-emitter current gain. Furthermore, the total area of the BJT structure 500 is reduced. In some embodiments, a total height required for the BJT structure 500 may be approximately 1.053 μm, which is smaller than a typical BJT structure, but the present disclosure is not limited thereto.

Figure 6:
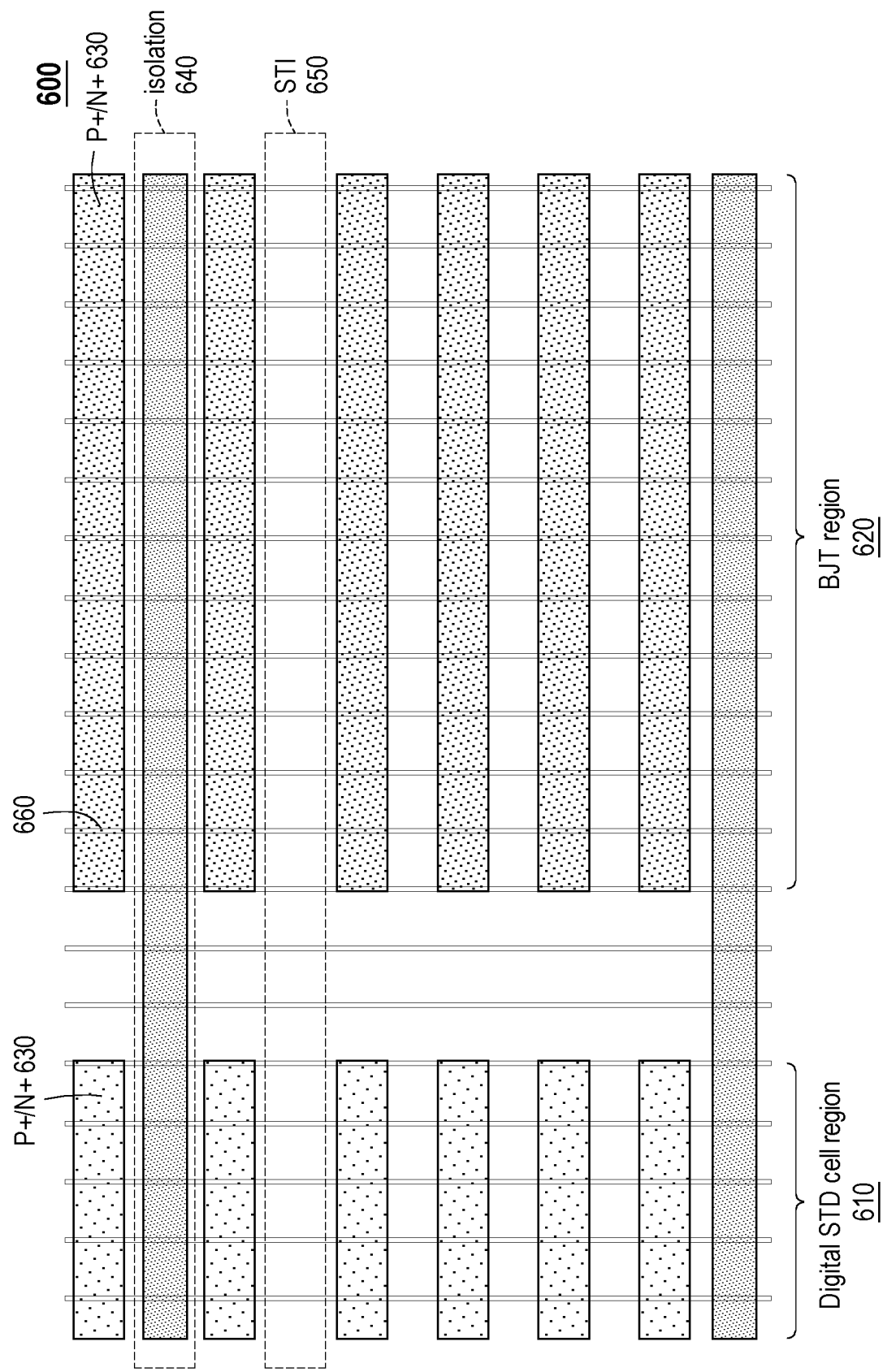
FIG. 6 is an exemplary layout diagram illustrating a layout design of a portion of an IC structure, in accordance with some embodiments of the present disclosure.

FIG. 6 is an exemplary layout diagram illustrating a layout design 600 of a portion of an IC structure, in accordance with some embodiments of the present disclosure. As shown in FIG. 6, the layout design 600 includes an array of standard cells arranged in rows and columns. It is noted that a different number of rows, sub-rows or columns is within the contemplated scope of the present disclosure.

The layout design 600 includes a standard cell region 610 configured to form one or more circuit elements, and a BJT region 620 adjacent to the standard cell region 610. In some embodiments, the BJT region 620 directly abuts a Fin Boundary (FB) region. For example, the Fin Boundary (FB) region can be a region where a grid or pattern is generated having a plurality of fins with fixed widths and fixed spaces therebetween. FinFET active areas in the Fin Boundary (FB) region are bound together by design rules to share a set of equally spaced fins. In the embodiments of FIG. 6, the layout design 600 includes active region layout patterns 630 extending in a first direction (e.g., an x-direction) in both the digital standard cell region 610 and the BJT region 620, and isolation layout patterns 640 and STI layout patterns 650 extending in the first direction in both the digital standard cell region 610 and the BJT region 620. As shown in FIG. 6, each of the isolation layout patterns 640 and STI layout patterns 650 is between active region layout patterns 630, each of which may either be a p-type (P+) or an n-type (N+) active region.

The layout design 600 further includes gate layout patterns 660, which may be polysilicon, extending in a second direction (e.g., a y-direction orthogonal to the x-direction) in both the standard cell region 610 and the BJT region 620, and overlapping fin layout patterns extending in the first direction and being over active region layout patterns 630. For example, in the standard cell region 610, the gate layout patterns 660 may be used for manufacturing corresponding gate structures in the IC. It is noted that other configurations in the gate layout patterns 660 are within the scope of the present disclosure.

Accordingly, the BJT structure 400 in FIG. 4A-FIG. 4C and the BJT structure 500 in FIGS. 5A and 5B may be arranged in the BJT region 620 of the layout design 600, in order to provide BJT components directly embedded into a CPU design. Thus, thermal sensors with less area penalty can be implemented closer to the CPU to detect the CPU temperature precisely.

Figure 7:
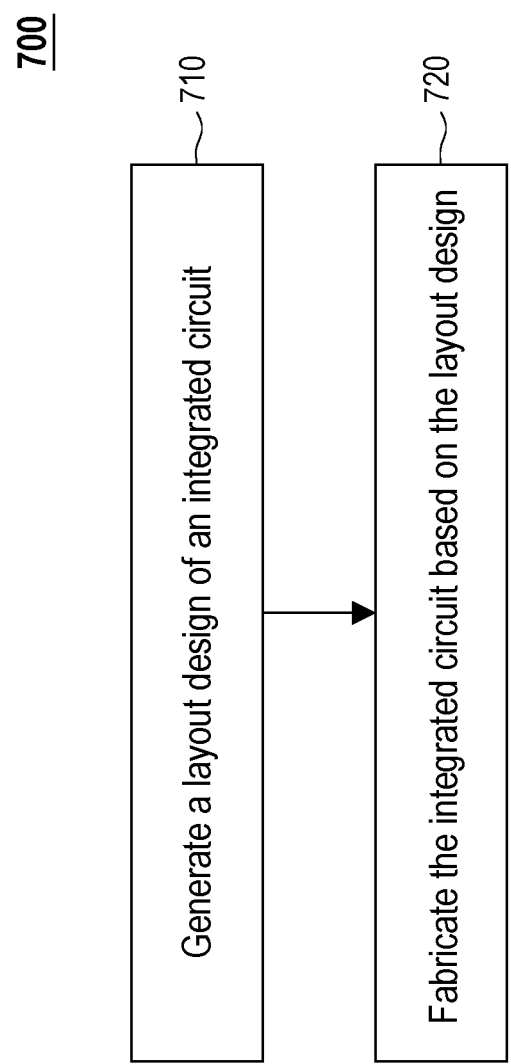
FIG. 7 is a flowchart of a method of forming and fabricating an integrated circuit, in accordance with some embodiments of the present disclosure.

FIG. 7 is a flowchart of an exemplary method 700 of forming and fabricating an integrated circuit, in accordance with some embodiments. Method 700 includes generating an integrated circuit layout (step 710); and fabricating an integrated circuit based on the integrated circuit layout (step 720). Some other steps may be briefly described herein. Additional steps may be performed before, during, and/or after method 700 for forming or manufacturing an integrated circuit. In some embodiments, method 700 may be used to form and manufacture thermal sensor circuit 100 in FIG. 1, and/or circuit 200 in FIG. 2, but the present disclosure is not limited thereto.

Step 710 includes generating an integrated circuit layout. For example, a processor of a computer system may be configured to execute instructions stored in a memory of the computer system to generate an integrated circuit layout (e.g., layout design 300 in FIG. 3 or layout design 600 in FIG. 6). In some embodiments, the integrated circuit layout in step 710 is in a graphic database system file format, such as a graphic database system II (GDSII) file format. As discussed in the embodiments above, the integrated circuit layout may include first standard cells (e.g., cells 312-318 in FIG. 3) arranged along a first direction, second standard cells (e.g., cells 322-328 in FIG. 3) arranged along the first direction, and third standard cells (e.g., cells 332-338 in FIG. 3) arranged along the first direction between the first standard cells and the second standard cells. The third standard cells form a transistor cell for a BJT structure (e.g., BJT structure 400 in FIG. 4A-4C or BJT structure 500 in FIG. 5A-5B).

Step 720 includes fabricating an integrated circuit based on the layout design. For example, semiconductor manufacturing equipment may be configured to manufacture integrated circuits based on the integrated circuit layout in step 710. As shown in FIGS. 4A-4C and 5A-5B, the integrated circuit may include the BJT structure having emitters in a first well having a first conductive type, collectors in respective second wells having a second conductive type different from the first conductive type, the second wells being spaced apart from each other with the first well therebetween; and bases in the first well and between the emitters and the collectors.

Figure 8:
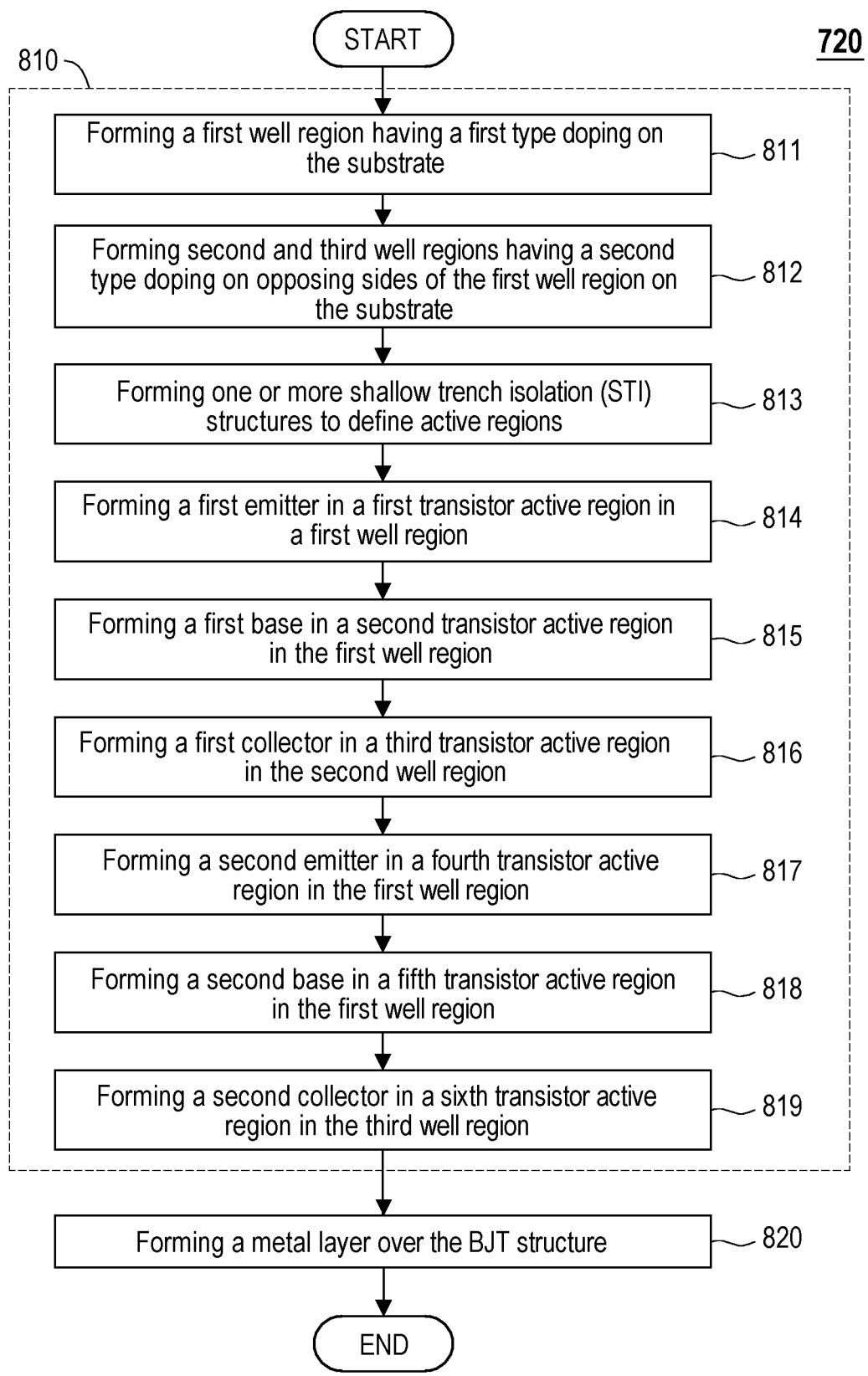
FIG. 8 is a flowchart of detailed operations for fabricating a semiconductor structure, in accordance with some embodiments of the present disclosure.

FIG. 8 is a flowchart of detailed operations in step 720, in accordance with some embodiments of the present disclosure. Step 720 can be performed for fabricating the semiconductor structure or integrated circuits illustrated in any of FIGS. 1-6, but the present disclosure is not limited thereto. Although step 720 disclosed herein may be illustrated and/or described as a series of operations or steps, it will be appreciated that, in some instances, illustrated and/or described operations can be performed in different orders from what is illustrated and/or described herein. Further, one or more illustrated and/or described operations may be performed concurrently, while some illustrated and/or described operations may be carried out in sub-operations or sub-steps, which can similarly be re-ordered with regards to other illustrated and/or described operations in some embodiments.

In operation 810, a bipolar junction transistor (BJT) structure (e.g., the BJT structure 400 in FIG. 4A-FIG. 4C or the BJT structure 500 in FIGS. 5A and 5B) is formed, which includes standard cells with different cell heights and different widths of active regions. Particularly, operation 810 includes operations 811-819.

In operation 811, a first well region (e.g., n-well region 430 in FIG. 4B) having a first type doping is formed in the substrate. In operation 812, second and third well regions (e.g., p-well regions 420, 440 in FIG. 4B) having a second type doping different from the first type doping are formed at opposing sides of the first well region in the substrate.

In operation 813, one or more shallow trench isolation (STI) structures (e.g., STI structures 451, 453, 455, 457, and 459 in FIG. 4B) are formed. Each STI structure separates and defines regions as active areas. Then, in operations 814-819, active regions can be formed in the active areas as the emitter, the collector, and the base of the BJT structure.

For example, a first STI structure (e.g., the STI structure 455 in FIG. 4B) is formed separating a first transistor active region (e.g., active region including active regions 434a, 434b in FIG. 4B) and a fourth transistor active region (e.g., active regions including regions 436a, 436b in FIG. 4B), and a second STI structure (e.g., the STI structure 453 in FIG. 4B) is formed separating the first transistor active region and a second transistor active region (e.g., active region including active regions 432a, 432b in FIG. 4B). A width of the first STI structure may be greater than a width of the second STI structure.

In some embodiments, a third STI structure (e.g., the STI structure 451 in FIG. 4B) is formed separating the second transistor active region and a third transistor active region (e.g., the active region 422 in FIG. 4B). A width of the third STI structure may be substantially the same as the width of the second STI structure.

In some embodiments, a fourth STI structure (e.g., the STI structure 457 in FIG. 4B) is formed separating the fourth transistor active region and a fifth transistor active region (e.g., active region including regions 438a and 438b in FIG. 4B). A width of the fourth STI structure may be substantially the same as the width of the third STI structure.

In some embodiments, a fifth STI structure (e.g., the STI structure 459 in FIG. 4B) is formed separating the fifth transistor active region and a sixth transistor active region (e.g., the active region 442 in FIG. 4B). A width of the fifth STI structure may be substantially the same as the width of the fourth STI structure.

In operations 814-819, active regions are formed in the active areas as the emitter, the collector, and the base of the BJT structure. Particularly, in operation 814, a first emitter (e.g., emitter E1 in FIG. 4B) is formed in the first transistor active region (e.g., active region including regions 434a, 434b in FIG. 4B) in the first well region. In operation 815, a first base (e.g., base B1 in FIG. 4B) is formed in the second transistor active region (e.g., active region including regions 432a, 432b in FIG. 4B) in the first well region. In operation 816, a first collector (e.g., collector C1 in FIG. 4B) is formed in a third transistor active region (e.g., active region 422 in FIG. 4B) in the second well region. The second transistor active region is between the first transistor active region and the third transistor active region. In some embodiments, a width of the first transistor active region is greater than a width of the second transistor active region.

In operation 817, a second emitter (e.g., emitter E2 in FIG. 4B) is formed in a fourth transistor active region (e.g., active regions including regions 436a, 436b in FIG. 4B) in the first well region. In operation 818, a second base (e.g., base B2 in FIG. 4B) is formed in a fifth transistor active region (e.g., active region including regions 438a and 438b in FIG. 4B) in the first well region. In operation 819, a second collector (e.g., collector C2 in FIG. 4B) is formed in a sixth transistor active region (e.g., the active region 442 in FIG. 4B) in the third well region. The fifth transistor active region is between the fourth transistor active region and the sixth transistor active region, and the second and the third well regions are spaced apart from each other with the first well region therebetween.

In operation 820, a metal layer (e.g., metal layer M0 in FIG. 4C) is formed over the BJT structure. The metal layer may include one or more conductive features (e.g., the conductive features 460 in FIG. 4C) for interconnections. For example, the one or more conductive features may be used to connect the first collector and the second collector to a ground reference.

By the operations described above, a method for fabricating a semiconductor structure can be performed to provide BJT components embedded into a CPU design or a bandgap design for thermal sensor applications, which can be located adjacent to hot spot locations of the CPU and detect CPU temperatures more accurately using less chip area. In addition, the method 700 can be implemented in various processes, including various CMOS, FinFET, FinFET, Gate-All-Around FET, and Nanosheet FET manufacturing processes.

Figure 9:
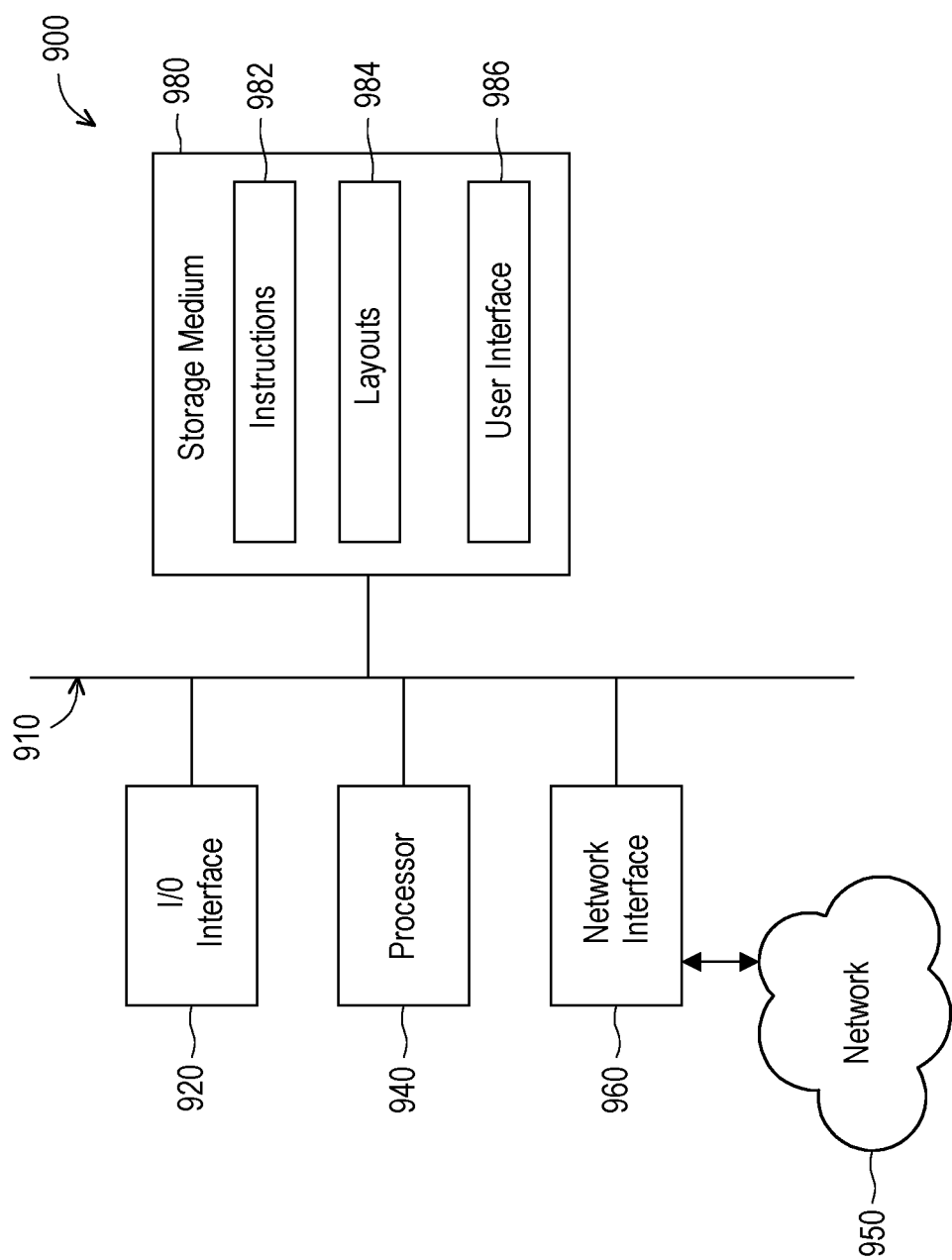
FIG. 9 is a block diagram of an exemplary system for designing and generating an integrated circuit layout, in accordance with some embodiments of the present disclosure.

FIG. 9 is a block diagram of an exemplary system 900 for designing and generating an integrated circuit layout, in accordance with some embodiments. System 900 is configured to design and generate one or more layouts of integrated circuits. In some embodiments, system 900 is also configured to manufacture one or more integrated circuits based on the one or more layouts of the integrated circuits described herein. System 900 includes a bus 910, an input/output (I/O) interface 920, a processor 940, a network interface 960, and a non-transitory, computer-readable storage medium 980. The I/O interface 920, the processor 940, the network interface 960, and the storage medium 980 are electrically coupled to each other through the bus 910. The network interface 960 is configured to connect to a network 950 so that the system 900 is connected to one or more external computer systems and/or equipment through the network 950.

The I/O interface 920 is coupled to external devices for receiving information and commands and providing output information. For example, the I/O interface 920 may be coupled to a keyboard, a keypad, a mouse, a trackball, a trackpad, and/or cursor direction keys for receiving information and commands to the system 900.

The processor 940 includes one or more of a central processing unit (CPU), a multi-core processor, a distributed processing system, an application-specific integrated circuit (ASIC), and/or a hardware processing circuit. The processor 940 is configured to execute instructions stored in the storage medium 980 to cause the system 900 to perform a portion or all of the steps of method 700. For example, the processor 940 may be configured to design and generate one or more layouts of integrated circuits. In some embodiments, the processor 940 is also configured to fabricate or manufacture one or more integrated circuits based on the one or more layouts.

The Network interface 960 is configured to connect the system 900 to one or more other computer systems and/or equipment (not shown) through the network 950. The network interface 960 includes one or more wireless network interfaces, e.g., Bluetooth, Wi-Fi, worldwide interoperability for microwave access (WiMAX), general packet radio service (GPRS), and/or wideband code division multiple access (WCDMA) transceivers, and/or one or more wireline network interfaces, e.g., Ethernet, universal serial bus (USB), and/or IEEE 13154 interface cards. In some embodiments, two or more systems 900 may be configured to perform methods described herein and exchange information, e.g., layouts and fabrication data, among two or more systems 900 through network 950.

The storage medium 980 includes one or more of an electronic, magnetic, optical, electromagnetic, infrared, and/or semiconductor apparatus or device. For example, the storage medium 980 includes a semiconductor or solid-state memory, a magnetic tape, a removable computer diskette, a random-access memory (RAM), a read-only memory (ROM), a rigid magnetic disk, and/or an optical disk. In some embodiments, the storage medium 980 includes a compact disk-read only memory (CD-ROM), a compact disk-read/write (CD-R/W) disc, and/or a digital video disc (DVD).

The storage medium 980 stores instructions 982 for causing the system 900 to perform the method 700. The processor 940 is configured to execute the instructions 982 stored in the storage medium 980 to cause the system 900 to perform a portion or all of the steps of the method 700. In some embodiments, the storage medium 980 is configured to serve as an interface between the system 900 and semiconductor manufacturing equipment (not shown) for manufacturing integrated circuits.

In some embodiments, the storage medium 980 also stores information for performing method 700 and information generated during the performance of the method 700, such as layouts 984, a user interface 986, and fabrication data. In some embodiments, layouts 984 include one or more layout patterns of integrated circuits.

In some embodiments, the storage medium 980 also stores instructions for interfacing with semiconductor manufacturing machines (not shown). The instructions, when executed, cause the processor 940 to generate manufacturing instructions to control the semiconductor manufacturing machines to perform the method 700 during a manufacturing process.

The System 900 is configured to receive information related to integrated circuit layouts through the I/O interface 920 and/or the network interface 960. The information is transferred, through the bus 910, to the processor 940 for generating layout patterns and data and manufacturing integrated circuits. The layout patterns and data are stored in the storage medium 980 as the layouts 984. In some embodiments, the system 900 is also configured to receive information related to a user interface through the I/O interface 920 and/or the network interface 960. The information is stored in the storage medium 980 as the user interface 986. In some embodiments, the system 900 is configured to receive information related to fabrication data through the I/O interface 920 and/or the network interface 960. The information is stored in the storage medium 980. The fabrication data includes fabrication parameters that the system 900 may use to manufacture integrated circuits.

In some embodiments, a portion of the steps of the method 700 is implemented as a standalone software application for execution by a processor. In some embodiments, a portion of the steps of the method 700 is implemented as a software application that is a part of another software application. In some embodiments, a portion of the steps of the method 700 is implemented as a plug-in to a software application. In some embodiments, a portion of the steps of the method 700 is implemented as a software application that is a portion of an electronic design automation (EDA) tool. In some embodiments, a portion of the steps of the method 700 is implemented as a software application that is used by an EDA tool. The EDA tool is used to generate one or more layouts of the integrated circuits described herein. In some embodiments, the layouts of the integrated circuits are stored on a non-transitory computer-readable medium. In some embodiments, the layouts of the integrated circuits are generated by using a tool such as Cadence® Virtuoso® or other layout generating tools. In some embodiments, the layouts of the integrated circuits are generated based on netlists which are created based on schematic circuit diagrams. In some embodiments, a portion of the steps of method 700 is implemented by a manufacturing device to fabricate or manufacture the integrated circuits described herein by using a set of masks. The masks are manufactured based on one or more layouts generated by the system 900. In some embodiments, the system 900 generates layouts of integrated circuits that occupy less area than other approaches.

Figure 10:
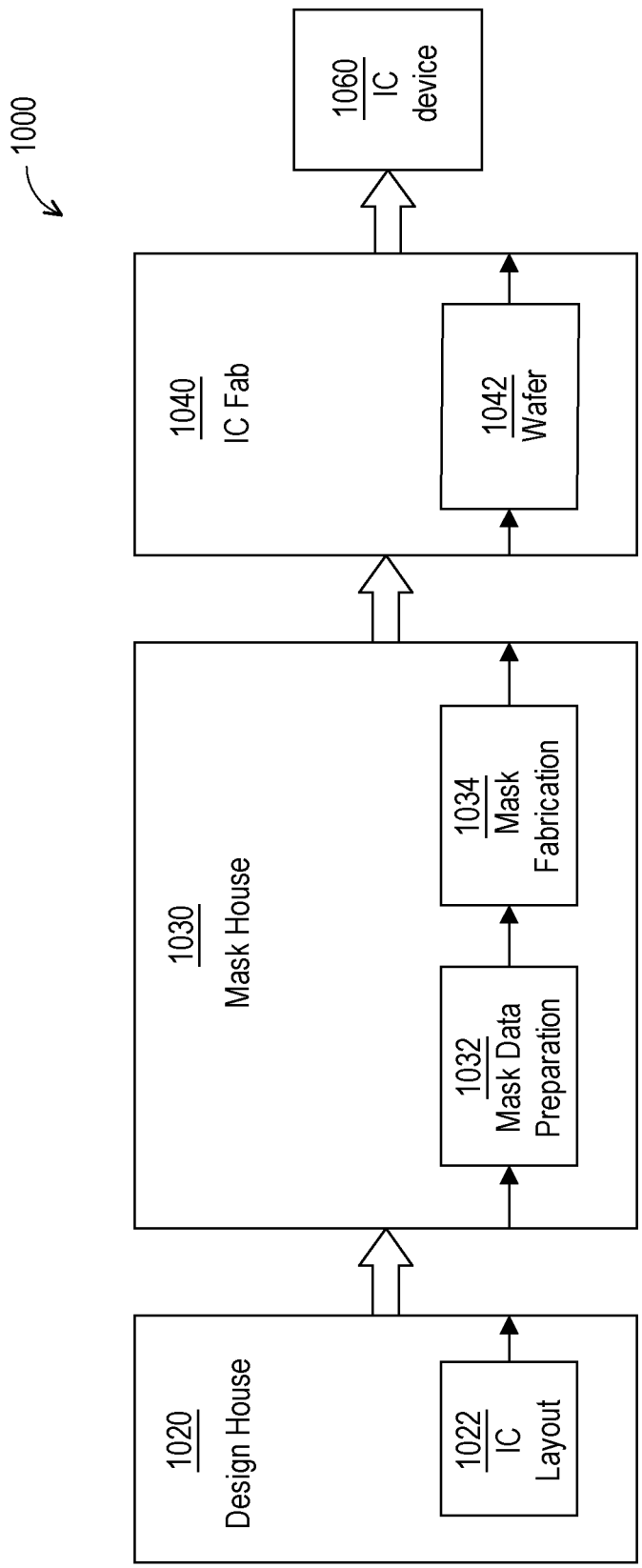
FIG. 10 is a block diagram of an exemplary integrated circuit manufacturing system, in accordance with some embodiments of the present disclosure.

FIG. 10 is a block diagram of an exemplary integrated circuit manufacturing system 1000, in accordance with some embodiments. Integrated circuit manufacturing system 1000 includes a design house 1020, a mask house 1030, and an integrated circuit manufacturer or fabricator (Fab) 1040, that interact with one another in the design, development, and manufacturing cycles and/or services related to manufacturing an integrated circuit (IC) device 1060. The components in system 1000 are connected by a communications network. In some embodiments, the communications network is a single network. In some embodiments, the communications network is a variety of different networks, such as an intranet and the Internet. The communications network includes wireline and/or wireless communication channels. Each component interacts with one or more of the other components and provides services to and/or receives services from one or more of the other components. In some embodiments, two or more of design house 1020, mask house 1030, and IC fab 1040 are connected locally. In some embodiments, two or more of design house 1020, mask house 1030, and IC fab 1040 coexist in a common facility and share common resources.

Design house 1020 designs and generates integrated circuit (IC) layout 1022. IC layout 1022 includes geometrical patterns designed for IC device 1060. The geometrical patterns are patterns of metal, oxide, or semiconductor layers that make up the plurality of components of IC device 1060. The semiconductor layers combine to form a plurality of IC features. For example, a portion of IC layout 1022 includes a plurality of IC features, such as active regions, gate electrodes, source electrodes, drain electrodes, metal lines, and vias of interlayer interconnections, and openings for bonding pads, to be formed in a semiconductor substrate (e.g., a silicon wafer) and a plurality of material layers disposed on the semiconductor substrate. Design house 1020 automatically implements an appropriate design procedure to form IC layout 1022 for the integrated circuits described herein. The design procedure includes one or more of logic design, physical design, and/or place and route. IC layout 1022 is presented in one or more data files including information of the geometrical patterns. For example, IC layout 1022 may be in a GDSII file format or a Design Framework II (DFII) file format.

Mask house 1030 includes mask data preparation 1032 and mask fabrication 1034. Mask house 1030 uses IC layout 1022 to automatically manufacture one or more masks for fabricating a plurality of layers of IC device 1060. Mask house 1030 performs mask data preparation 1032 to translate IC layout 1022 into a representative data file (RDF). Mask data preparation 1032 provides the RDF to mask fabrication 1034. Mask fabrication 1034 includes a mask writer. The mask writer automatically converts the RDF to an image on a substrate, such as a photomask (e.g., reticle) for a semiconductor wafer. IC layout 1022 is manipulated by mask data preparation 1032 to comply with particular characteristics of the mask writer and/or requirements of IC fab 1040. In some embodiments, mask data preparation 1032 and mask fabrication 1034 in FIG. 10 may be collectively referred to as mask data preparation.

In some embodiments, mask data preparation 1032 includes optical proximity correction (OPC) which uses lithography enhancement techniques to compensate for image errors, such as those that may arise from diffraction, interference, other process effects, and the like. The OPC adjusts IC layout 1022. In some embodiments, mask data preparation 1032 includes further resolution enhancement techniques (RET), such as off-axis illumination, sub-resolution assist features, phase-shifting masks, other suitable techniques, and the like or any combinations thereof. In some embodiments, inverse lithography technology (ILT) is also used, which treats the OPC as an inverse imaging problem.

In some embodiments, mask data preparation 1032 includes an automatic mask rule checker (MRC) that checks IC layout 1022 that has undergone processes in the OPC with a set of mask creation rules containing certain geometric and/or connectivity restrictions to ensure sufficient margins and account for variability in semiconductor manufacturing processes and the like. In some embodiments, the MRC modifies IC layout 1022 to compensate for limitations of mask fabrication 1034, which may include the undoing of certain modifications performed by the OPC in order to meet mask creation rules.

In some embodiments, mask data preparation 1032 includes lithography process checking (LPC) that simulates processing that will be implemented by IC fab 1040 to fabricate IC device 1060. LPC simulates this processing based on IC layout 1022 to create a simulated manufactured device for IC device 1060. The processing parameters in the LPC simulation include parameters associated with a plurality of processes of an IC manufacturing cycle, parameters associated with tools used for manufacturing an IC, and/or other aspects of the manufacturing process. The LPC takes into account a plurality of factors, such as aerial image contrast, depth of focus (DOF), mask error enhancement factor (MEEF), other suitable factors, and the like or any combinations thereof. In some embodiments, after a simulated manufactured device has been created by the LPC, if the simulated device is not close enough in shape to satisfy design rules, the OPC and/or MRC are repeated to further refine IC layout 1022.

The above description of mask data preparation 1032 has been simplified for the purposes of clarity. In some embodiments, mask data preparation 1032 includes additional features such as a logic operation (LOP) to modify the IC design layout according to manufacturing rules. Additionally, the processes applied to IC layout 1022 during mask data preparation 1032 may be executed in a variety of different orders.

After mask data preparation 1032 and during mask fabrication 1034, a mask or a group of masks are fabricated based on the modified IC layout. In some embodiments, an electron-beam (e-beam) or a mechanism of multiple e-beams automatically forms a pattern on a mask (e.g., photomask or reticle) based on the modified IC layout. The mask can be formed in a plurality of technologies. In some embodiments, the mask is formed by using binary technology. In some embodiments, a mask pattern includes opaque regions and transparent regions. A radiation beam, such as an ultraviolet (UV) beam, used to expose the image-sensitive material layer (e.g., photoresist) which has been coated on a wafer, is blocked by the opaque region and transmits through the transparent regions. In one example, a binary mask includes a transparent substrate (e.g., fused quartz) and an opaque material (e.g., chromium) coated in the opaque regions of the mask. As another example, the mask is formed using a phase shift technology. In a phase shift mask (PSM), a plurality of features in the pattern formed on the mask are configured to have proper phase difference to enhance the resolution and imaging quality. In some embodiments, the phase shift mask may be attenuated PSM or alternating PSM. One or more masks generated by mask fabrication 1034 are used in a variety of processes. For example, the masks are used in an ion implantation process to form a plurality of doped regions in a semiconductor wafer, in an etching process to form a plurality of etching regions in the semiconductor wafer, and/or in other suitable processes.

IC fab 1040 is an IC fabrication component that includes one or more manufacturing subcomponents for the fabrication of a variety of different IC products. In some embodiments, IC fab 1040 is a semiconductor foundry. For example, IC fab 1040 includes a first manufacturing subcomponent for the front end fabrication of a plurality of IC products (i.e., front-end-of-line (FEOL) fabrication), a second manufacturing subcomponent for the back end fabrication for the interconnection and packaging of the IC products (i.e., back-end-of-line (BEOL) fabrication), and/or a third manufacturing subcomponent for other services of the foundry entity.

IC fab 1040 uses the one or more masks fabricated by mask house 1030 to fabricate IC device 1060. Thus, IC fab 1040 at least indirectly uses IC layout 1022 to fabricate IC device 1060. In some embodiments, a semiconductor wafer 1042 is fabricated by IC fab 1040 using the one or more masks to form IC device 1060. Semiconductor wafer 1042 includes a silicon substrate or other suitable substrate having material layers formed thereon. Semiconductor wafer 1042 further includes one or more doped regions, dielectric features, multilevel interconnects, and the like formed at subsequent manufacturing steps.

System 1000 is shown as having design house 1020, mask house 1030, and IC fab 1040 as separate components. However, it is understood that one or more of design houses 1020, mask houses 1030, and/or IC fabs 1040 can be part of the same components.

In some embodiments, a semiconductor device is disclosed that includes a bipolar junction transistor (BJT) structure including emitters in a first well having a first conductive type, collectors in respective second wells, the second wells having a second conductive type different from the first conductive type and being spaced apart from each other with the first well therebetween, and bases in the first well and between the emitters and the collectors. The BJT structure includes active regions having different widths that form the emitters, the collectors, and the bases.

In some embodiments, a semiconductor structure is also disclosed that includes a first well region on a substrate, the first well region having a first type doping; a second well region and a third well region on opposing sides of the first well region on the substrate, the second and the third well regions having a second type doping different from the first type doping; a bipolar junction transistor (BJT) structure having a first emitter formed in a first transistor active region in the first well region, a first base formed in a second transistor active region in the first well region, and a first collector formed in a third transistor active region in the second well region; and a second emitter formed in a fourth transistor active region in the first well region, a second base formed in a fifth transistor active region in the first well region, and a second collector formed in a sixth transistor active region in the third well region.

In some embodiments, a method for fabricating a semiconductor structure is also disclosed that includes forming a bipolar junction transistor (BJT) structure including a plurality of first standard cells with different widths of active regions by: forming a first emitter in a first transistor active region in a first well region having a first type doping; forming a first base in a second transistor active region in the first well region; and forming a first collector in a third transistor active region in a second well region, the second well region having a second type doping different from the first type doping, wherein the second transistor active region is between the first transistor active region and the third transistor active region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a bipolar junction transistor (BJT) structure comprising:
emitters in a first well having a first conductive type;
collectors in respective second wells, the second wells having a second conductive type different from the first conductive type and being spaced apart from each other with the first well therebetween; and
bases in the first well and between the emitters and the collectors, wherein the BJT structure comprises active regions having different widths that form the emitters, the collectors, and the bases;
wherein the BJT structure is formed in a transistor cell comprising a plurality of standard cells with different cell heights, and the standard cells forming the collectors are smaller in height than the standard cells forming the bases, and the standard cells forming the bases are smaller in height than the standard cells forming the emitters.

2. The semiconductor device of claim 1, wherein each of the emitters is formed by a first cell including a first one of the active regions having a first width, and each of the bases is formed by a second cell including a second one of the active regions having a second width, the first width being greater than the second width.

3. The semiconductor device of claim 2, further comprising:
a first shallow trench isolation structure separating two of the emitters; and
a second shallow trench isolation structure separating one of the emitters from one of the bases.

4. The semiconductor device of claim 3, wherein a width of the first shallow trench isolation structure is greater than a width of the second shallow trench isolation structure.

5. The semiconductor device of claim 3, further comprising:
a third shallow trench isolation structure separating one of the collectors from one of the bases.

6. The semiconductor device of claim 5, wherein a width of the third shallow trench isolation structure is substantially the same as a width of the second shallow trench isolation structure.

7. The semiconductor device of claim 1, wherein the BJT structure is formed in the transistor cell adjacent to a plurality of first standard cells and a plurality of second standard cells and abutting a fin boundary region.

8. A semiconductor structure, comprising:
a first well region on a substrate, the first well region having a first type doping;
a second well region and a third well region on opposing sides of the first well region on the substrate, the second well region and the third well region having a second type doping different from the first type doping; and
a bipolar junction transistor (BJT) structure having a first emitter formed in a first transistor active region in the first well region, a first base formed in a second transistor active region in the first well region, and a first collector formed in a third transistor active region in the second well region; and a second emitter formed in a fourth transistor active region in the first well region, a second base formed in a fifth transistor active region in the first well region, and a second collector formed in a sixth transistor active region in the third well region;
wherein the BJT structure is formed in a plurality of standard cells with different cell heights, and the standard cells forming the first collector and the second collector are smaller in height than the standard cells forming the first base and the second base, and the standard cells forming the first base and the second base are smaller in height than the standard cells forming the first emitter and the second emitter.

9. The semiconductor structure of claim 8, wherein the BJT structure is formed by the standard cells abutting a fin boundary region.

10. The semiconductor structure of claim 9, wherein the BJT structure is formed by at least a first type of standard cell and a second type of standard cell having different widths of active regions.

11. The semiconductor structure of claim 8, wherein a width of the first transistor active region is greater than a width of the second transistor active region.

12. The semiconductor structure of claim 8, wherein a width of a first shallow trench isolation structure separating the first transistor active region and the fourth transistor active region is greater than a width of a second shallow trench isolation structure separating the first transistor active region and the second transistor active region.

13. The semiconductor structure of claim 12, wherein a width of a third shallow trench isolation structure separating the second transistor active region and the third transistor active region is substantially the same as the width of the second shallow trench isolation structure.

14. The semiconductor structure of claim 8, further comprising:
   a metal layer comprising one or more conductive features connecting the first collector and the second collector.

15. A semiconductor structure, comprising:
   a bipolar junction transistor (BJT) structure including a plurality of first standard cells with different widths of active regions, the BJT structure comprising:
      a first emitter formed in a first transistor active region in a first well region having a first type doping;
      a first base formed in a second transistor active region in the first well region; and
      a first collector formed in a third transistor active region in a second well region, wherein the second well region has a second type doping different from the first type doping, and the second transistor active region is between the first transistor active region and the third transistor active region;
   wherein the first standard cells have different cell heights, and the first standard cell forming the first collector is smaller in height than the first standard cell forming the first base, and the first standard cell forming the first base is smaller in height than the first standard cell forming the first emitter.

16. The semiconductor structure of claim 15, further comprising:
   a second emitter, formed in a fourth transistor active region in the first well region;
   a second base, formed in a fifth transistor active region in the first well region; and
   a second collector, formed in a sixth transistor active region in a third well region having the second type doping, wherein the fifth transistor active region is between the fourth transistor active region and the sixth transistor active region, and wherein the second well region and the third well region being spaced apart from each other with the first well region therebetween.

17. The semiconductor structure of claim 16, further comprising:
   a first shallow trench isolation structure, configured to separate the first transistor active region and the fourth transistor active region; and
   a second shallow trench isolation structure, configured to separate the first transistor active region and the second transistor active region, wherein a width of the first shallow trench isolation structure is greater than a width of the second shallow trench isolation structure.

18. The semiconductor structure of claim 17, further comprising:
   a third shallow trench isolation structure, configured to separate the second transistor active region and the third transistor active region, wherein a width of the third shallow trench isolation structure is substantially the same as the width of the second shallow trench isolation structure.

19. The semiconductor structure of claim 15, further comprising:
   a metal layer over the BJT structure, the metal layer comprising one or more conductive features connecting the first collector.

20. The semiconductor structure of claim 15, wherein a width of the first transistor active region is greater than a width of the second transistor active region.

* * * * *